McDermott et al.

Date of Patent: Jul. 11, 1995

[54] COMPOSITION FOR FORMING CONTROLLED TIN-LEAD SOLDER ALLOY COMPOSITION

[75] Inventors: Bernard C. McDermott, Carlsbad; Mohi Sobhani, Encino, both of Calif.

[73] Assignee: Hughes Aircraft Company, Los Angeles, Calif.

[21] Appl. No.: 168,340

[22] Filed: Dec. 17, 1993

[51] Int. Cl.⁶ .............................. C25D 3/56
[52] U.S. Cl. ................................. 205/253
[58] Field of Search ........................ 205/253

[56] References Cited
PUBLICATIONS

Hirsch, Tin and Tin-Lead Plating, Part III—Tin-Lead From Fluoroborate, Metal Finishing, vol. 82, No. 12, Dec. 1984, pp. 84–85.

Rose, The Condensed Chemical Dictionary, 7th ed., 1966, p. 424 (no month).

*Primary Examiner*—John Niebling
*Assistant Examiner*—Edna Wong
*Attorney, Agent, or Firm*—M. E. Lachman; M. W. Sales; W. K. Denson-Low

[57] ABSTRACT

A composition for forming an electrodeposited tin-lead alloy of controlled composition comprising:
  (a) about 1.5 to 1.8 percent by weight lead fluoroborate;
  (b) about 2.5 to 2.75 percent by weight tin fluoroborate;
  (c) about 91 to 92 percent by weight fluoroboric acid;
  (d) about 2.7 to 3.4 percent by weight boric acid; and
  (e) about 0.3 to 0.9 percent by weight Peptone, wherein the alloy comprises 62–64 weight percent tin and 36–38 weight percent lead.

3 Claims, No Drawings

COMPOSITION FOR FORMING CONTROLLED TIN-LEAD SOLDER ALLOY COMPOSITION

BACKGROUND OF THE INVENTION

1. Field of the Invention

The present invention relates generally to a tin-lead eutectic solder, and, more particularly, to a composition for forming a tin-lead eutectic alloy with controlled composition by electroplating.

2. Description of Related Art

Eutectic and near-eutectic tin-lead solder alloys are used to provide solder joints in a variety of electronic devices. The solder joint provides both an electrical connection and a mechanical link between electronic devices and connectors. In order to improve the solder joint, one or both of the surfaces to be soldered together are sometimes electroplated with a layer of the solder alloy prior to the soldering procedure. This electroplating is accomplished using known electroplating techniques and a solution of a metal salt and a strong acid or base, as described, for example, in "Metal Finishing 1991 Guide Book and Directory", Metal and Plastics Publication Inc., page 272.

In the case of a tin-lead eutectic solder, a typical plating bath solution comprises: 7–8 ounces per gallon (oz/gal) stannous tin, 3–4 oz/gal lead, 3–5 oz/gal fluoroboric acid, and 2–3 oz/gal Peptone.

One problem that arises in the use of such a solution is that the fluoride ion from the fluoroboric acid combines with tin to form insoluble or colloidal products which are not readily removed by filtration and which contaminate the electroplated deposit and requires that the plating bath be replaced about every 6 months. Another problem which arises in the use of the above-noted solution is that the Peptone codeposits in the plated deposit. These effects result in a deposit in which the tin-lead ratio on a single surface varies and causes unreliable solder connections. In addition, the solder discolors and has poor solderability, the solder flow is erratic, the solder has poor cosmetic appearance, and there is a relatively high incidence of touch-up required.

Thus, a need exists for a composition for plating a tin-lead alloy which does not form any unwanted deposits in the plated deposit, and which has a uniform and closely controlled tin-lead composition.

SUMMARY OF THE INVENTION

The general purpose of the present invention is to provide a composition for forming an electrodeposited tin-lead alloy of controlled composition. This composition possesses all the advantages of the above-mentioned electroplating compositions while overcoming their above-noted significant disadvantages.

The above-described general purpose of the present invention is accomplished by providing a composition comprising:

(a) about 1.5 to 1.8 percent by weight lead fluoroborate;
(b) about 2.5 to 2.75 percent by weight tin fluoroborate;
(c) about 91 to 92 percent by weight fluoroboric acid;
(d) about 2.7 to 3.4 percent by weight boric acid; and
(e) about 0.3 to 0.9 percent by weight Peptone, wherein said alloy comprises 62–64 weight percent tin and 36–38 weight percent lead.

A method for forming the controlled tin-lead alloy is also provided.

These and other features and attendant advantages of the present invention will become better understood by reference to the following description of the preferred embodiments of the invention.

DESCRIPTION OF THE PREFERRED EMBODIMENTS

The present invention is based upon the discovery that tin-lead eutectic solder of a composition which is controlled to ±2 percent can be formed by accurately controlling the amounts of the boric acid and Peptone which are added to the plating bath. Conventional tin-lead solder, which is well-known and widely used, contains 70–50 weight percent tin and 30–50 weight percent lead. Lead-tin eutectic solder contains about 63 weight percent tin and about 37 weight percent lead. In accordance with the present invention, this composition is controlled to contain 62–64 weight percent tin and 36–38 weight percent lead.

The composition of the present invention comprises:

(a) about 1.5 to 1.8 percent by weight lead fluoroborate;
(b) about 2.5 to 2.75 percent by weight tin fluoroborate;
(c) about 91 to 92 percent by weight fluoroboric acid;
(d) about 2.7 to 3.4 percent by weight boric acid; and
(e) about 0.3 to 0.9 percent by weight Peptone.

The amount of boric acid is in the range of about 10 to 12 ounces per gallon of plating bath solution or about 2.7 to 3.4 percent by weight of the solution. The boric acid acts as a buffer and controls the ionization of the fluoroboric acid in the solution which produces fluoride ions. These fluoride ions, in turn, cause the formation of insoluble salts. Since the amount of fluoride ions is suppressed, they are not available to react with the free stannous and lead ions. This provides a completely soluble system which remains clear indefinitely.

The amount of Peptone in the present composition is within the range of about 0.3 to 0.9 percent by weight (or about 0.75 to 1.0 percent by volume). This reduction in the amount of Peptone as compared to the amount used in the prior art unexpectedly produces an improvement in the deposition rate. Peptone is a trade name for a natural protein product, which may be obtained from Allied Chemical Company.

The tin-lead deposit formed from the present composition has a uniform composition across the surface of the deposit, which improves the reliability of the solder connection, reduces touch up, and reduces inspection time. The deposit is smooth in appearance and the throwing power is excellent. The deposit has less organic matter from the Peptone codeposited in the plated thickness. Since organic residues in the plated deposit are the major cause of solder dewetting, the deposit formed from the present composition has a greatly reduced, if not eliminated, incidence of solder dewetting. In addition, the deposit exhibits superior reflow characteristics. Further, the plating bath constituent concentrations are easier to maintain since precipitation of metallic salts has been eliminated. The plating bath advantageously has a clear straw yellow color and very low viscosity. Finally, the plating bath does not develop any solution compatibility problems over long periods of standing and is able to immediately return to full performance after being reactivated to normal plating operations.

EXAMPLE

A composition was prepared comprising 8 to 10 grams per liter (g/l) of lead fluoroborate, 13 to 15 g/l tin fluoroborate, 350 to 400 g/l fluoroboric acid, 11 to 15 g/l boric acid, and 0.09 to 0.27 g/l Peptone.

Using known electroplating procedures, the composition above was used to electroplate eutectic tin-lead solder on a substrate comprising a copper-clad laminate with epoxy/glass or polyimide. The composition of the deposit was determined by titration to be 63 percent tin and 37 percent lead. The composition was determined by titration to be uniform across the surface of the substrate. This test was repeated 40 times with the same results.

Storage of conventional plating of solder showed discoloration after only 30 days of storage under normal conditions. The present invention showed no discoloration of deposit after one year of storage in a conventional plating environment. In addition, there has been no evidence of solder dewetting after reflow for a period of three years. The same plating bath has been used for five years.

Thus, in accordance with the present invention, there has been provided a composition which produces a tin-lead eutectic solder deposit having a composition controlled to within ±2 percent and having a uniform composition across the entire surface of the deposit. In addition, this plating bath composition has a very long lifetime.

Having thus described exemplary embodiments of the present invention, it should be noted by those skilled in the art that the disclosures within are exemplary only and that various other alternatives, adaptations and modifications may be made within the scope of the present invention. Accordingly, the present invention is not limited to the specific embodiments as illustrated herein, but is only limited by the following claims.

What is claimed is:

1. A composition for forming an electrodeposited eutectic tin-lead alloy of controlled composition comprising;
   (a) 1.5 to 1.8 percent by weight lead fluoroborate;
   (b) 2.5 to 2.75 percent by weight tin fluoroborate;
   (c) 91 to 92 percent by weight fluoroboric acid;
   (d) 2.7 to 3.4 percent by weight boric acid; and
   (e) 0.3 to 0.9 percent by weight Peptone,
   wherein the control of the amounts of said boric acid and said Peptone provides said alloy comprising a controlled composition of 62-64 weight percent tin and 36-38 weight percent lead.

2. The composition of claim 1 comprising:
   (a) about 8 to 10 grams per liter (g/l) lead fluoroborate;
   (b) about 13 to 15 g/l tin fluoroborate;
   (c) about 350 to 400 g/l fluoroboric acid;
   (d) about 11 to 15 g/l boric acid; and
   (e) about 0.09 to 0.27 g/l Peptone.

3. A method for forming an electroplated eutectic tin-lead alloy of controlled composition comprising the steps of;
   (a) providing a composition comprising:
      (1) 1.5 to 1.8 percent by weight lead fluoroborate;
      (2) 2.5 to 2.75 percent by weight tin fluoroborate;
      (3) 91 to 92 percent by weight fluoroboric acid;
      (4) 2.7 to 3.4 percent by weight boric acid; and
      (5) 0.3 to 0.9 percent by weight Peptone,
   (b) electroplating said alloy from said composition onto a substrate, wherein the amounts of said boric acid and said Peptone are controlled to provide said alloy having said controlled composition comprising 62-64 weight percent tin and 36-38 weight percent lead.

* * * * *